US008875583B2

(12) United States Patent
Torashima et al.

(10) Patent No.: US 8,875,583 B2
(45) Date of Patent: Nov. 4, 2014

(54) ELECTROMECHANICAL TRANSDUCER AND METHOD OF MANUFACTURING THE SAME

(75) Inventors: Kazutoshi Torashima, Yokohama (JP); Ayako Kato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 13/425,346

(22) Filed: Mar. 20, 2012

(65) Prior Publication Data

US 2012/0266682 A1 Oct. 25, 2012

(30) Foreign Application Priority Data

Apr. 19, 2011 (JP) ................................ 2011-093370

(51) Int. Cl.

| | |
|---|---|
| ***G01L 11/00*** | (2006.01) |
| ***G01L 9/12*** | (2006.01) |
| ***G01R 27/26*** | (2006.01) |
| ***H04R 19/00*** | (2006.01) |
| ***B06B 1/02*** | (2006.01) |

(52) U.S. Cl.

CPC .................................... *B06B 1/0292* (2013.01)

USPC ................. 73/702; 73/718; 73/724; 324/686; 367/181

(58) Field of Classification Search

USPC .................................................... 73/700–756

See application file for complete search history.

(56) References Cited

U.S. PATENT DOCUMENTS

| | | | | |
|---|---|---|---|---|
| 8,288,192 | B2 | 10/2012 | Chang | |
| 8,344,587 | B2 | 1/2013 | Soeda | |
| 2007/0264732 | A1 | 11/2007 | Chen | |
| 2010/0328898 | A1* | 12/2010 | Kabir | 361/713 |
| 2011/0114496 | A1* | 5/2011 | Dopp et al. | 205/109 |
| 2011/0169510 | A1* | 7/2011 | Kandori et al. | 324/686 |
| 2012/0086307 | A1 | 4/2012 | Kandori et al. | |
| 2012/0224327 | A1* | 9/2012 | Kabir | 361/713 |
| 2012/0256519 | A1* | 10/2012 | Tomiyoshi et al. | 310/300 |
| 2012/0262770 | A1* | 10/2012 | Torashima et al. | 359/199.2 |
| 2014/0007693 | A1* | 1/2014 | Torashima et al. | 73/658 |
| 2014/0010052 | A1* | 1/2014 | Torashima et al. | 367/181 |

FOREIGN PATENT DOCUMENTS

| | | | |
|---|---|---|---|
| CN | 101883309 | A | 10/2010 |
| CN | 102015127 | A | 4/2011 |
| EP | 2135685 | A | 12/2009 |
| JP | 2010-98454 | | 4/2010 |
| JP | 2011-004280 | A | 1/2011 |

OTHER PUBLICATIONS

U.S. Appl. No. 13/421,791, filed Mar. 15, 2012 by Kazutoshi Torashima et al.

Chinese Office Action dated Jun. 3, 2014 for counterpart Chinese Appln No. 201210114687.2.

* cited by examiner

*Primary Examiner* — Andre Allen

(74) *Attorney, Agent, or Firm* — Fitzpatrick, Cella, Harper & Scinto

(57) ABSTRACT

Disclosed is an electromechanical transducer, including: a cell including a substrate, a vibration film, and a supporting portion of the vibration film configured to support the vibration film so that a gap is formed between the substrate and the vibration film; and a lead wire that is placed on the substrate with an insulator interposed therebetween and extends to the cell, wherein the insulator has a thickness greater than the thickness of the supporting portion. The electromechanical transducer can reduce parasitic capacitance to prevent an increase in noise, a reduction in bandwidth, and a reduction in sensitivity.

14 Claims, 3 Drawing Sheets

ELECTROMECHANICAL TRANSDUCER AND METHOD OF MANUFACTURING THE SAME

BACKGROUND OF THE INVENTION

1. Field of the Invention

The present invention relates to an electromechanical transducer such as a capacitive electromechanical transducer for use as an ultrasonic transducer or the like, and to a method of manufacturing such an electromechanical transducer.

2. Description of the Related Art

Micromachining technology has made possible micrometer-scale fabrication of micromachine parts. Using such parts, a variety of very small functional transducers have been developed. Capacitive electromechanical transducers such as capacitive micromachined ultrasonic transducers (CMUTs) manufactured using such technology have been studied as alternatives to piezoelectric transducers. Such capacitive electromechanical transducers enable transmission and reception of ultrasound by using vibration of a vibration film, while it can easily achieve good broadband characteristics particularly in liquid.

Concerning such capacitive electromechanical transducers, Japanese Patent Application Laid-Open (JP-A) No. 2010-098454 discloses a transducer in which the parasitic capacitance between a wire connecting a plurality of upper electrodes and a lower electrode is reduced using a monocrystalline silicon vibration film formed by bonding onto a silicon substrate or other processes. According to this publication, a silicon substrate is used as a lower electrode, and upper electrodes are provided on the monocrystalline silicon vibration films. The upper electrode on each vibration film is connected to a wire, and a supporting portion of the vibration film provided between the lower electrode and the wire has a cavity so that the parasitic capacitance generated between the wire and the lower electrode is reduced.

SUMMARY OF THE INVENTION

In the above capacitive electromechanical transducer having a monocrystalline silicon vibration film formed on a silicon substrate by bonding or the like, a silicon layer including the monocrystalline silicon vibration film can be used as an electrode, and the silicon substrate can also be used as another electrode. In order to more efficiently decrease noise, degradation of broadband characteristics, and a reduction in sensitivity, it is desirable that parasitic capacitance occurring between the silicon substrate and the silicon layer including the monocrystalline silicon vibration film are reduced. Particularly when a lead wire is formed on the silicon layer so that electrical signals can be transmitted and received, a parasitic capacitance that can easily occur in a large amount between the lead wire and the silicon substrate is desirably reduced.

From another perspective, in the above capacitive electromechanical transducer having a monocrystalline silicon vibration film, while the parasitic capacitance can be reduced by forming an insulator under the lead wire, it is more desirable that the insulator on the vibration film, which is deposited when the insulator is formed after the formation of the vibration film and which can function as a vibration film together with the monocrystalline silicon part, is removed. Such removal can lead to reduced variations in thickness of the entire vibration film. However, when the insulator on the vibration film is removed, other variations in the thickness of the vibration film may occur due to the removal. This may cause variations in the spring constant or bending of the monocrystalline silicon vibration film, so that the uniformity of the capacitive electromechanical transducer may decrease, which may increase variations in the element performance.

In view of the above problems, the present invention provides an electromechanical transducer, including: a cell including a substrate, a vibration film, and a supporting portion of the vibration film configured to support the vibration film so that a gap is formed between the substrate and the vibration film; and a lead wire which is placed on the substrate with an insulator interposed therebetween and which extends to the cell, wherein the insulator has a thickness greater than the thickness of the supporting portion.

In view of the above problems, the present invention also provides a method of manufacturing an electromechanical transducer including a cell including a substrate, a vibration film, and a supporting portion of the vibration film configured to support the vibration film so that a gap is formed between the substrate and the vibration film, which includes the steps of: forming an insulating layer on one surface of a first silicon substrate and forming a recess for the gap and a portion for the supporting portion; bonding a second silicon substrate to the insulating layer; thinning the second silicon substrate to form a silicon layer including at least a portion for the vibration film; oxidizing a part of the silicon layer other than the portion for the vibration film; and forming an electrically-conductive layer on the oxide, produced in the oxidizing step, to form a lead wire.

Since the vibration film-equipped electromechanical transducer of the present invention has the insulator, which is provided under the lead wire and which is thicker than the supporting portion, it can reduce the parasitic capacitance between the lead wire and the substrate-side electrode. Thus, an increase in noise, a reduction in bandwidth, and a reduction in sensitivity can be prevented.

In the method for manufacturing an electromechanical transducer of the present invention, a silicon layer other than the vibration film-forming portion is oxidized, and a lead wire is formed on the resulting oxide. Thus, due to the presence of the thermal oxide, the parasitic capacitance between the lead wire and the silicon substrate-side electrode can be reduced, so that an increase in noise, a reduction in bandwidth, and a reduction in sensitivity can be prevented.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The gist of the present invention is that an insulator thicker than a supporting portion of a vibration film is provided at a cell lead wire placement portion on a substrate such as a silicon substrate so that the parasitic capacitance between the lead wire and a substrate-side electrode can be reduced.

Figure 1A:
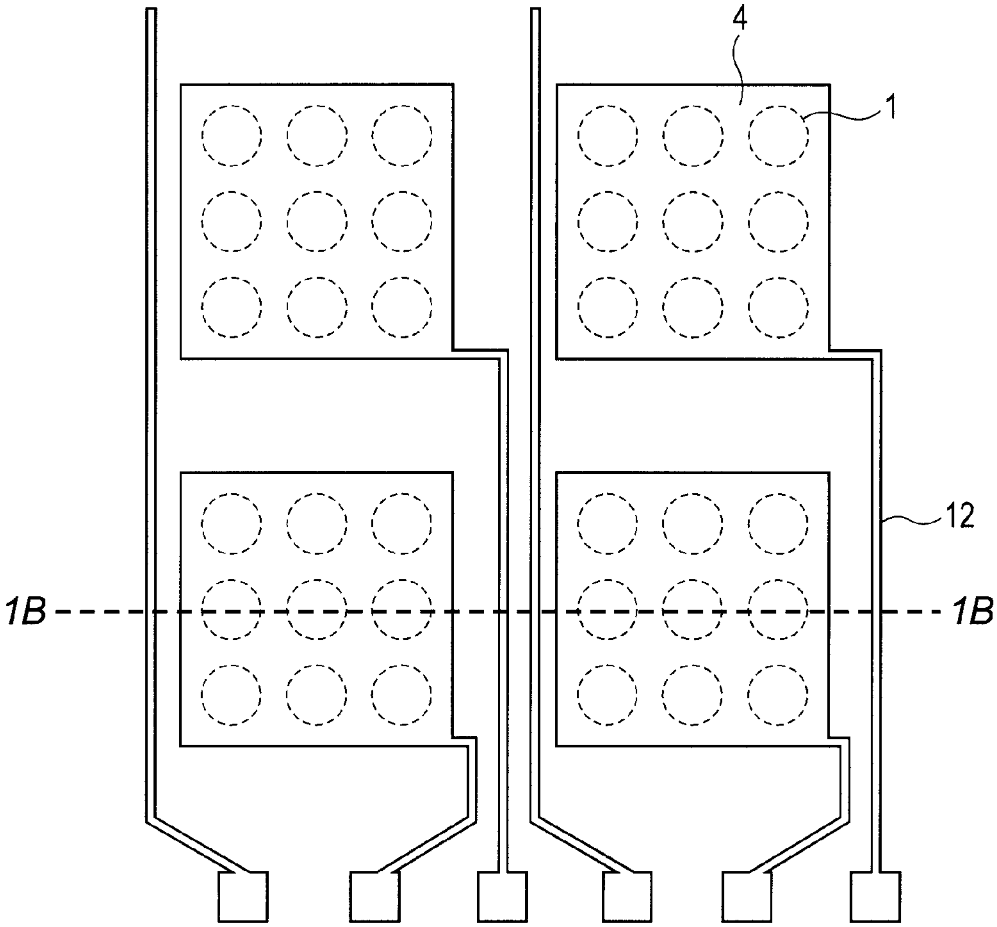
FIG. 1A is a diagram illustrating an electromechanical transducer according to an embodiment of the present invention and Example 1.
Figure 1B:
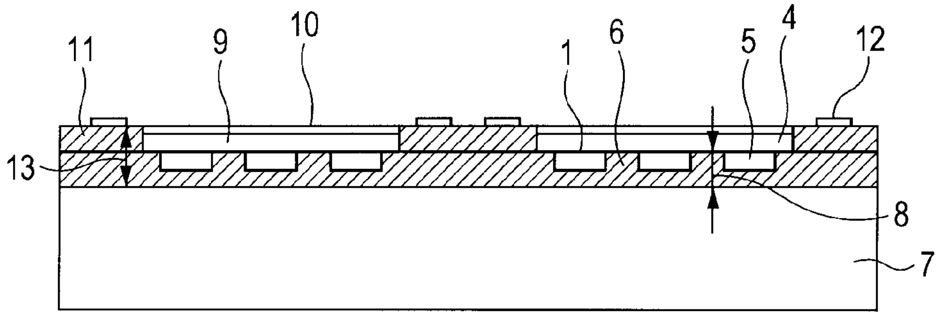
FIG. 1B is a cross-sectional view taken along the line 1B-1B of FIG. 1A.

Referring to FIGS. 1A and 1B that illustrate an embodiment of the present invention, FIG. 1A is a top view of a capacitive electromechanical transducer of this embodiment, and FIG. 1B is a cross-sectional view taken along the line 1B-1B of FIG. 1A. In this embodiment, cells 1 and lead wires 12 are provided. In this structure, a cell corresponds to each membrane structure including a silicon substrate, a vibration film, and a supporting portion of the vibration film configured to support the vibration film so that a gap such as an air gap is formed between the silicon substrate and the vibration film. While the structure shown in FIG. 1 is an array structure including four transducer elements each having cells 1, the number of the elements is not limited thereto. While each element includes nine cells 1, the number of the cells is also not limited thereto.

In this embodiment, the cell 1 includes a monocrystalline silicon vibration film 4, a gap 5, a supporting portion 6 of the vibration film configured to support the monocrystalline silicon vibration film 4, and a silicon substrate 7. In contrast to a vibration film formed by deposition (such as a silicon nitride film), the monocrystalline silicon vibration film 4 has little residual stress and small variations in thickness and in vibration film spring constant. Therefore, variations in performance between the elements or between the cells are small. The supporting portion 6 is preferably made of an insulator such as silicon oxide or silicon nitride. If it is not made of an insulator, an insulating layer should be formed on the silicon substrate 7 to insulate the silicon substrate 7 from the monocrystalline silicon vibration film 4. As described below, the silicon substrate 7 is used as a common electrode between the plurality of elements and therefore it is preferably a low-resistance substrate with a resistance of 0.1 Ωcm or less so that an ohmic contact can be easily formed. The term “ohmic” means that the resistance is constant regardless of the current direction and the voltage level.

The portion under the lead wire 12 is made of an insulator 11 extending from the surface of the silicon substrate 7 to the lower side of the lead wire, and the thickness 13 of the insulator 11 under the lead wire is greater than the thickness 8 of the supporting portion 6. The insulator 11 is preferably a thermal oxide film. In a case where the transducer includes a plurality of elements, the insulator 11 may also be placed around each element, so that each of the elements can be electrically isolated. FIG. 1 shows that the thickness 13 of the insulator 11 is almost equal to the sum of the thickness 8 of the supporting portion 6 and the thickness of the vibration film 4 (including an aluminum thin film 10 as described below). Alternatively, the thickness of the insulator may be equal to or more than the sum of the thickness of the supporting portion and the thickness of the vibration film.

This structure enables transmission and reception of electrical signals through the lead wire without formation of through wiring penetrating the element in a thickness direction thereof. This structure can also increase the distance between the lead wire 12 and the silicon substrate 7, which functions as a common electrode (first electrode), so that it can reduce parasitic capacitance. Therefore, it can prevent an increase in noise, a reduction in sensitivity, and a reduction in bandwidth, which would otherwise be caused by parasitic capacitance. Particularly in the case of an array structure, the lead wires of the respective elements may differ in length and, in such a case, parasitic capacitance and resistance may differ from element to element, so that sensitivity, bandwidth, and the amount of noise may differ from element to element. In the capacitive electromechanical transducer according to this embodiment, on the contrary, the distance between the lead wire 12 and the silicon substrate 7 serving as a common electrode can be increased, so that even in an array structure, an increase in noise, a reduction in sensitivity, and a reduction in bandwidth can be prevented.

The drive principle in this embodiment is as follows. Each element is formed on the same silicon substrate 7 which can be used as a common electrode (first electrode). The monocrystalline silicon vibration film 4 also functions as an electrode for each individual element (second electrode). The monocrystalline silicon vibration film 4 is electrically connected to the lead wire 12, so that an electrical signal for each individual element can be transmitted through the lead wire 12. When the capacitive electromechanical transducer receives ultrasound, a DC voltage (e.g., a DC voltage of 100 V or less) is applied to the silicon substrate 7 from voltage applying means (not shown). When it receives ultrasound, the monocrystalline silicon vibration film 4 is deformed, so that the distance of the gap 5 between the vibration film 4 and the silicon substrate 7 is changed, and thus the capacitance is also changed. The capacitance change causes a current to flow in the lead wire 12. The current is detected as a voltage by a current-voltage transducer (not shown) so that the ultrasound can be received. Alternatively, a DC voltage and an AC voltage can also be applied to the silicon substrate 7 or the monocrystalline silicon vibration film 4, and the monocrystalline silicon vibration film 4 can be vibrated by an electrostatic force, and thus ultrasound is transmitted.

As described above, the silicon layer under the lead wire 12 is replaced with the insulator 11 in this embodiment, so that parasitic capacitance generated between the lead wire 12 and the silicon substrate 7 can be reduced. This can prevent an increase in noise, a reduction in sensitivity, and a reduction in bandwidth, which would otherwise be caused by parasitic capacitance. The use of the monocrystalline silicon vibration film also makes film thickness control easy and reduces residual stress in contrast to the use of a vibration film formed by deposition, such as a silicon nitride film vibration film. In addition, no high-residual-stress material is deposited on the monocrystalline silicon vibration film, and the vibration film is made mainly of monocrystalline silicon, which has low residual stress. Therefore, variations in the spring constant of the vibration film and variations in the bending of the vibration film can be reduced, so that variations in performance between cells or elements can be reduced to a very low level, which enables to stabilize transmission and reception characteristics.

The supporting portion and the gap can be formed on a first substrate, and a second substrate can be bonded thereto to form the vibration film, so that variations in the distance between the monocrystalline silicon vibration film and the silicon substrate can be reduced. Thus, variations in the sensitivity of reception/transmission between cells or elements can be reduced. The insulator is preferably a thermal oxide. When such a thermal oxide is formed, silicon is also consumed. Therefore, for example, when a 1 μm thick silicon layer is thermally oxidized, an about 2 μm thick thermal oxide can be formed. This enables to further reduce the parasitic capacitance between the lead wire 12 and the silicon substrate 7.

A groove may be further formed in the silicon layer around the element including a plurality of cells, so that a structure for electrical isolation between a plurality of elements can be formed. Stress may occur when the silicon layer to be located under the lead wire is converted into an oxide by thermal oxidation or the like, but the element isolation structure can suppress the bending of the silicon vibration film 4 caused by the stress.

Figure 3A:
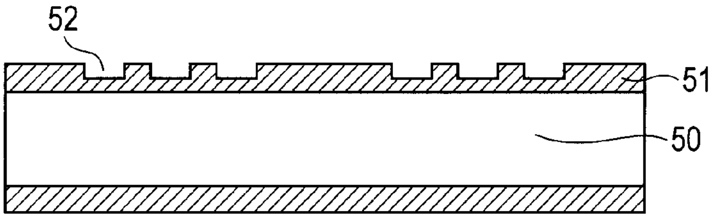
FIGS. 3A, 3B, 3C, 3D, 3E, and 3F are cross-sectional views of a process of manufacturing an electromechanical transducer according to another embodiment of the present invention and Example 3.

Referring to FIGS. 3A to 3F that illustrate an example of the manufacturing process according to this embodiment, FIGS. 3A to 3F are cross-sectional views of a capacitive electromechanical transducer, which has almost the same structure as shown in FIG. 1. As shown in FIG. 3A, an insulating layer 51 is formed on a first silicon substrate 50, and recesses for forming gaps 52 and portions for forming supporting portions of the vibration film are formed. The first silicon substrate 50 preferably has a resistivity of about 0.1 Ωcm or less. If the insulating layer 51 is directly bonded to a second silicon substrate 53 for forming a monocrystalline silicon vibration film in the following step, it is preferably made of a silicon oxide film formed by thermal oxidation. This is because the direct bonding requires that the substrate to be bonded should have high flatness and low surface roughness and, on the other hand, the silicon oxide film formed by thermal oxidation has high flatness and it does not increase the surface roughness of the substrate, and thus the direct bonding can be easily conducted. The gaps 52 are formed by photolithography or etching.

Figure 3B:
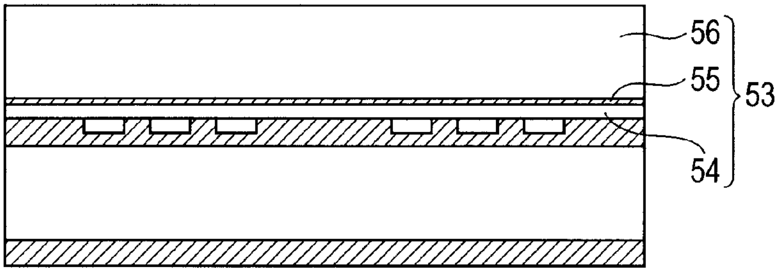

Subsequently, as shown in FIG. 3B, a second silicon substrate 53 for forming a monocrystalline silicon vibration film is bonded thereto by direct bonding. The direct bonding may be a method including activating the substrate surface and bonding it or a method including bonding the substrates with water molecules interposed therebetween and then heating them to increase the bond strength. As shown in FIG. 3B, this step may be performed using a silicon-on-insulator (SOI) substrate as the second silicon substrate 53 for forming the monocrystalline silicon vibration film. The SOI substrate has a structure including a silicon substrate (handle layer) 56, a surface silicon layer (active layer) 54, and a silicon oxide layer (BOX layer) 55 interposed between the substrate 56 and the layer 54. When the SOI substrate is used, since the active layer 54 of the SOI substrate can be used as a silicon layer including a monocrystalline silicon vibration film, the active layer side is bonded.

Figure 3C:
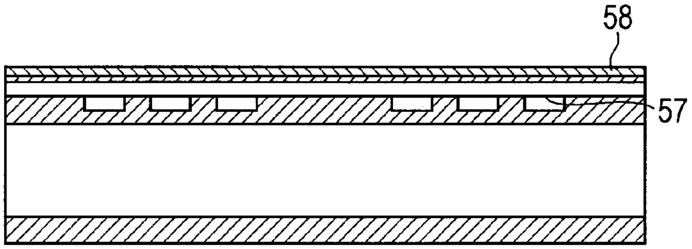

Subsequently, as shown in FIG. 3C, the second silicon substrate 53 is thinned, and a protective film 58 is formed on the silicon layer having the monocrystalline silicon vibration film. Since the silicon layer for forming the monocrystalline silicon vibration film is preferably several μm or less in thickness, the second silicon substrate 53 is thinned by etching, grinding, or chemical mechanical polishing (CMP).

As shown in FIG. 3C, when an SOI substrate is used as the second substrate, the SOI substrate is thinned by removing the handle layer 56 and the BOX layer 55. The handle layer 56 can be removed by grinding, CMP, or etching. The removal of the BOX layer 55 can be performed by oxide film etching (dry etching or etching with hydrofluoric acid). Since wet etching with hydrofluoric acid or the like can prevent the etching of silicon, it can be more preferably used so that variations in the thickness of the monocrystalline silicon vibration film 57 formed by the etching can be reduced. The active layer of the SOI substrate for forming the monocrystalline silicon vibration film can be prepared with reduced variations in thickness, so that variations in the thickness of the monocrystalline silicon vibration film 57 can be reduced. Therefore, variations in the spring constant of the vibration film of the capacitive electromechanical transducer can be reduced, so that variations in frequency during transmission and reception can be reduced. When the SOI substrate is not used as the second silicon substrate for forming the monocrystalline silicon vibration film, back grinding or CMP can be used to reduce the thickness to about 2 μm.

An insulator is formed under a lead wire in the following step, in which step the protective film 58 prevents the insulator from coming into direct contact with the monocrystalline silicon vibration film. When a silicon oxide film formed by thermal oxidation is used as the insulator, the monocrystalline silicon vibration film may also be oxidized, so that its thickness may vary. The silicon oxide film can be formed by thermal oxidation in such a manner that about 50% of the desired amount of film formation is attained by the oxidation of the silicon surface. Therefore, the protective film is preferably a silicon nitride film or any other material that does not undergo thermal oxidation.

As shown in FIG. 3C, the BOX layer 55 of the SOI substrate may be used without being removed, so that the protective film can have a two-layer structure including the BOX layer 55 and a silicon nitride film 58 formed thereon. If the SOI substrate is not used, a two-layer structure can be provided by forming an oxide film by chemical vapor deposition (CVD) and forming a silicon nitride film thereon. If the monocrystalline silicon vibration film is etched during the removal of the film formed on the monocrystalline silicon vibration film, variations in thickness will occur, so that variations in the spring constant of the vibration film or variations in the bending of the vibration film may occur. Therefore, the protective film is preferably removed by wet etching with hydrofluoric acid or any other etchant not attacking the monocrystalline silicon vibration film. Thus, the silicon oxide film is preferably formed directly on the monocrystalline silicon vibration film, and the silicon nitride film is preferably formed thereon. This enables to form the vibration film without variations in the thickness of the monocrystalline silicon vibration film 57.

Figure 3D:
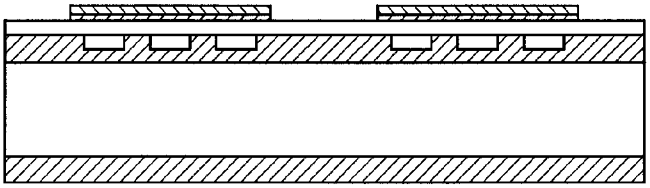
Figure 3E:
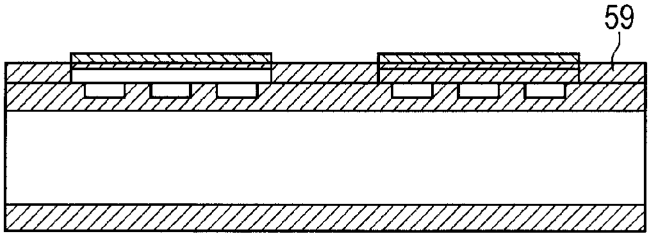
Figure 3F:
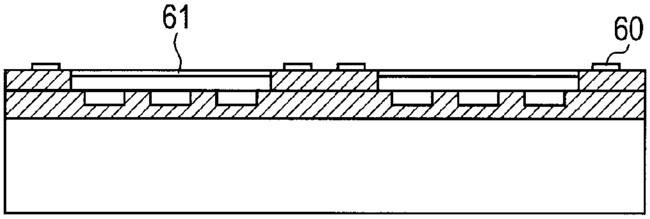

Subsequently, as shown in FIG. 3D, the protective film is removed at the part of the silicon layer to be oxidized, and as shown in FIG. 3E, thermal oxidation is performed from one surface of the silicon layer to the other surface so that an insulator 59 is formed. Subsequently, as shown in FIG. 3F, the protective film 58 on the silicon vibration film is removed, and a lead wire 60 is formed on the insulator 59. An aluminum thin film 61 or the like may be formed on the vibration film 57.

By this manufacturing method, a capacitive electromechanical transducer with reduced variations in the thickness and spring constant of the monocrystalline silicon vibration film and with reduced variations in performance can be easily formed. In addition, the parasitic capacitance between the lead wire 60 and the silicon substrate 50 serving as a common electrode can also be reduced, so that a reduction in sensitivity, a reduction in bandwidth, and an increase in noise can be prevented, which would otherwise be caused by parasitic capacitance. While the above bulk micromachining process is preferred to manufacture elements having the structure shown in FIG. 1B, it will be understood that such elements can also be manufactured by other processes (such as surface micromachining processes using sacrificing layer etching). It should be noted, however, that after a vibration film is protected by a protective film and an insulator including a part to be located under a lead wire is formed, the step of removing the unnecessary insulator and protective film should be performed appropriately.

Hereinafter, the present invention is described in detail with reference to more specific examples. It will be understood that the examples are not intended to limit the present invention and various changes and modifications can be made within the gist of the present invention.

EXAMPLE 1

The structure of a capacitive electromechanical transducer according to Example 1 is described with reference to FIGS. 1A and 1B. The capacitive electromechanical transducer of this example is an array structure including a plurality of transducer elements each having cells 1 and a lead wire 12. While FIG. 1A only shows four elements, the number of elements is not limited thereto.

The cells 1 each include a 1 μm thick monocrystalline silicon vibration film 4, a gap 5, a supporting portion 6 of the vibration film which is configured to support the monocrystalline silicon vibration film 4 and which have a resistivity of 0.01 Ωcm, and a silicon substrate 7. The silicon substrate 7 has a thickness of 300 μm and a resistivity of 0.01 Ωcm. While the cell 1 is circular in this example, it may be in any other shape such as a quadrangle or a hexagon. The monocrystalline silicon vibration film 4 is made mainly of monocrystalline silicon. Since no high-residual-stress layer is formed on the monocrystalline silicon vibration film 4, the uniformity between elements is high, and variations in transmittance/reception performance can be reduced. An about 200 nm thick aluminum thin film 10 or the like may also be formed to improve the electrically conducting properties of the monocrystalline silicon vibration film. When an aluminum thin film is formed on the monocrystalline silicon vibration film, the silicon layer between the cells 1 may also be converted into an insulator. This structure can reduce the parasitic capacitance between the electrodes. In this structure, the cells 1 are each a circle with a diameter of 30 μm, the supporting portion 6 is made of silicon oxide and has a height of 300 nm, and the distance of the gap 5 is 200 nm.

The lead wire 12 is formed on the insulator 11. In the structure, the thickness 13 of the insulator under the lead wire 12 is greater than the thickness 8 of the supporting portion 6 which is configured to support the monocrystalline silicon vibration film 4. The lead wire 12 is made of aluminum and it has a width of 10 μm and a height of 0.2 μm. The insulator 11 is a thermal oxide, which is an about 2 μm thick oxide formed by thermal oxidation from one surface of a silicon layer 9 to the other surface. Thus, the distance between the lead wire 12 and the silicon substrate 7 serving as a common electrode is made greater than that in the case where the silicon layer is not thermally oxidized. When the silicon layer is not thermally oxidized, the parasitic capacitance between the lead wire and the silicon substrate is about 10 pF. In contrast, when the insulator 11 is provided under the lead wire 12, the parasitic resistance can be reduced to about 1 pF. In this structure, sensitivity and bandwidth can be increased by 4% and 13%, respectively, and noise can be reduced by 35%, relative to those in the case where the silicon layer under the lead wire is not thermally oxidized. As described above, the parasitic capacitance can be reduced, so that a reduction in sensitivity, a reduction in bandwidth, and an increase in noise can be prevented.

The drive principle of this example is as described above in the embodiment section. When the transducer of this example is used in a material having similar acoustic impedance to a liquid, the transducer has a center frequency of about 7 MHz and a 3 dB frequency bandwidth from about 2.5 MHz to 11.5 MHz and therefore it has broadband characteristics. In the electromechanical transducer of this example, the silicon layer under the lead wire is thermally oxidized from one surface to the other, so that the parasitic capacitance between the lead wire and the silicon substrate serving as a common electrode can be reduced. Thus, an increase in noise, a reduction in sensitivity, and a reduction in bandwidth, which would otherwise be caused by parasitic capacitance, can be prevented in this structure.

EXAMPLE 2

Figure 2A:
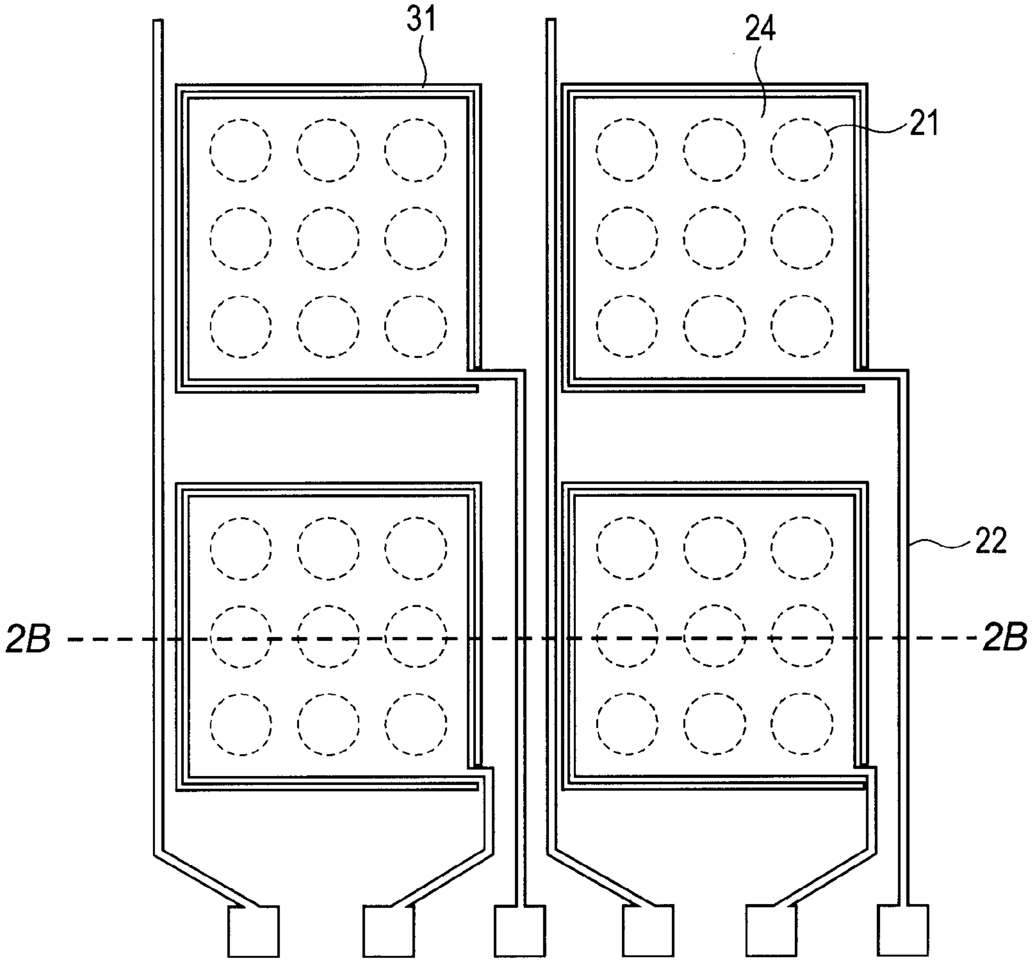
FIG. 2A is a diagram illustrating an electromechanical transducer according to Example 2 of the present invention.
Figure 2B:
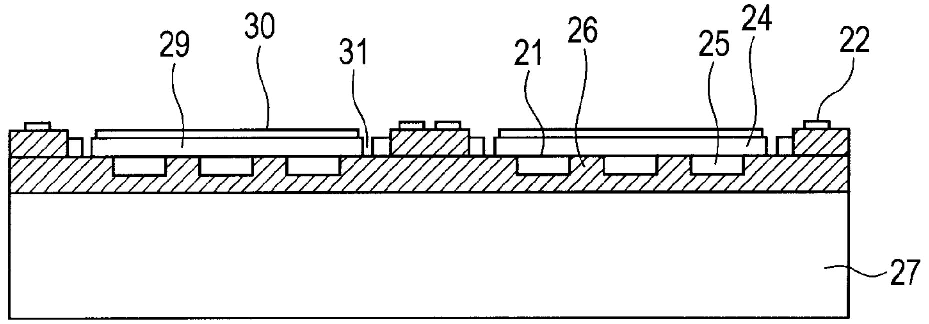
FIG. 2B is a cross-sectional view taken along the line 2B-2B of FIG. 2A.

The structure of a capacitive electromechanical transducer according to Example 2 is described with reference to FIGS. 2A and 2B. FIG. 2A is a top view, and FIG. 2B is a cross-sectional view taken along the line 2B-2B of FIG. 2A. The structure of the capacitive electromechanical transducer of Example 2 is almost the same as that of Example 1. In Example 2, a groove is formed in a silicon layer 29 around each element having a plurality of cells 21, so that an isolation structure 31 is formed to electrically insulate each element. In addition, the silicon layer under a lead wire 22 is thermally oxidized, so that the parasitic capacitance between the lead wire 22 and a silicon substrate 27 serving as a common electrode is reduced. In each cell 21, a gap 25 is formed below a vibration film 24 supported by a supporting portion 26 of the vibration film. An aluminum thin film 30 or the like may also be formed on the vibration film 24.

The parasitic capacitance between the lead wire 22 and the silicon substrate 7 is reduced in this structure, so that it can prevent an increase in noise, a reduction in sensitivity, and a reduction in bandwidth, which would otherwise be caused by parasitic capacitance. In addition, the portion to be thermally oxidized is only the silicon layer under the lead wire 22, and the silicon layer 29 around the element is removed so that the isolation structure 31 is formed. In the structure, therefore, stress generated in the process of oxidizing the silicon layer under the lead wire 22 has no influence on each element. While the silicon layer around each element is removed in this example, the silicon layer around the wire 22 may be alternatively removed. When such a structure is formed, each element does not suffer from deformation of the silicon vibration film or the like, which is caused by stress generated by the oxidation of the silicon layer, so that variation between cells or elements can be reduced.

EXAMPLE 3

A method of manufacturing a capacitive electromechanical transducer according to Example 3 is described with reference to FIGS. 3A to 3F. As shown in FIG. 3A, an insulating layer 51 of silicon oxide is formed on a 300 μm thick first silicon substrate 50 by thermal oxidation, and gaps 52 are formed by photolithography or etching. The first silicon substrate 50 has a resistivity of about 0.01 Ωcm.

Subsequently, as shown in FIG. 3B, a second silicon substrate 53 is bonded and thinned. In this step, the second silicon substrate 53 is an SOI substrate. The SOI substrate includes an active layer 54 with a thickness of 1 μm, a BOX layer 55 with a thickness of 0.4 μm, and a handle layer 56 with a thickness of 525 μm. The active layer 54 of the SOI substrate has a resistivity of 0.1 Ωcm. The active layer 54 used herein has a thickness variation of ±5% or less, and the active layer side is bonded directly. Since variations in the thickness of the active layer of the SOI substrate 53 is small, variations in the thickness of the monocrystalline silicon vibration film can be reduced. Thus, variations in the spring constant of the vibration film can be reduced in the capacitive electromechanical transducer. The SOI substrate is thinned by removing the handle layer 56. The removal of the handle layer is performed by back grinding or alkali etching.

Subsequently, as shown in FIG. 3C, a protective film 58 is formed on the active layer 54 for forming a vibration film 57.

The protective film 58 is a silicon nitride film. In this example, the protective film is formed using the BOX layer 55 of the SOI substrate in combination with a silicon nitride film formed thereon. The protective film is provided to prevent thermal oxidation of the upper part of the monocrystalline silicon vibration film 57 in the step of thermally oxidizing the silicon layer, which is performed after this step.

Subsequently, as shown in FIG. 3D, the protective film 58 is subjected to photolithography and etching so that the protective film 58 can be partially left on each element, and as shown in FIG. 3E, the portions not covered with the protective film (silicon layer portions other than those for forming vibration films) are oxidized. In this example, thermal oxidation is performed. Since the protective film 58 includes a silicon nitride film, which is not thermally oxidized, the silicon layer protected by the protective film, which includes the vibration film 57, is not thermally oxidized.

Subsequently, as shown in FIG. 3F, the protective film is removed, and an Al wire 60 is formed on the produced thermal oxide 59. The removal of the protective film is performed by a process including removing the silicon nitride film by dry etching and removing the BOX layer 55 by wet etching with an etchant containing hydrogen fluoride. The BOX layer 55 is removed by wet etching, which is not capable of etching the silicon layer, and thus the monocrystalline silicon vibration film is exposed. Therefore, variations in mechanical characteristic, such as variations in the vibration film thickness do not occur. The Al wire 60 is formed by a process including performing sputtering or vapor deposition of Al to form an electrically-conductive layer and performing photolithography and etching. Thus transmission and reception of electrical signals to and from each element is enabled.

A capacitive electromechanical transducer with reduced variations in the thickness and spring constant of the monocrystalline silicon vibration film and with reduced variations in performance can be easily formed by this manufacturing method. In addition, the parasitic capacitance between the lead wire and the silicon substrate serving as a common electrode can also be reduced, so that a reduction in sensitivity, a reduction in band, and an increase in noise can be prevented, which would otherwise be caused by parasitic capacitance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-093370, filed Apr. 19, 2011, which is hereby incorporated by reference herein in its entirety.

What is claimed is:

1. An electromechanical transducer, comprising:
- a substrate;
- a vibration film;
- a supporting portion of the vibration film configured to support the vibration film so that a gap is formed between the substrate and the vibration film;
- an insulator on the substrate; and
- a lead wire which is placed on the insulator and which extends to the vibration film,
- wherein the insulator has a thickness greater than the thickness of the supporting portion.

2. The electromechanical transducer according to claim 1, wherein the substrate is a silicon substrate functioning as a first electrode, the vibration film comprises a monocrystalline silicon film functioning as a second electrode, and the lead wire is electrically connected to the monocrystalline silicon film.

3. The electromechanical transducer according to claim 2, wherein the insulator is a thermal oxide of the monocrystalline film.

4. The electromechanical transducer according to claim 1, wherein the thickness of the insulator is equal to or greater than the sum of the thickness of the supporting portion and the thickness of the vibration film.

5. The electromechanical transducer according to claim 2, wherein a groove is formed in the monocrystalline silicon film around each of a plurality of elements, and each of the elements is electrically isolated.

6. A method of manufacturing an electromechanical transducer comprising a first substrate, a vibration film, and a supporting portion of the vibration film configured to support the vibration film so that a gap is formed between the first substrate and the vibration film, the method comprising:
- forming a first insulating layer on one surface of the first substrate which is silicon substrate;
- forming a recess for the gap in the first insulating layer and a portion for the supporting portion;
- bonding a second substrate, which comprises silicon layer, to the portion for the supporting portion;
- thinning the second substrate to leave the silicon layer;
- oxidizing a part of the silicon layer other than a portion for the vibration film to for a second insulating layer; and
- forming an electrically-conductive layer on the second insulating layer to form a lead wire.

7. The method of manufacturing an electromechanical transducer according to claim 6, further comprising:
- forming a protective film before the oxidizing step so that at least the vibration film-forming portion of the silicon layer is protected by the protective film; and
- removing the protective film after the oxidizing step, wherein
- in the oxidizing step, a part of the silicon layer other than the vibration film-forming portion, on which the protective film is formed, is thermally oxidized to form the second insulating layer oxide.

8. The method of manufacturing an electromechanical transducer according to claim 6, wherein an SOI substrate is used as the second substrate.

9. The method of manufacturing an electromechanical transducer according to claim 6, wherein a silicon nitride film is formed as the protective film.

10. The method of manufacturing an electromechanical transducer according to claim 9, wherein
- an SOI substrate is used as the second substrate,
- a silicon oxide layer and a surface silicon layer of the SOI substrate are left when the second substrate is thinned, and
- a two-layer structure comprising the silicon oxide layer and the silicon nitride film formed on the silicon oxide layer is formed as the protective film.

11. An electromechanical transducer, comprising:
- a silicon substrate,
- a first insulating layer on the silicon substrate,
- a vibration film, comprising a silicon layer, which is placed on the first insulating layer so that a gap is formed between the substrate and the vibration film,
- a second insulating layer, comprising a thermal oxide of the silicon layer, which is placed on the first insulating layer, and
- a lead wire which is placed on the second insulating layer and which extends to the vibration film.

12. The electromechanical transducer according to claim 11, wherein the combined thickness of the first insulating layer and the second insulating layer under the lead wire is greater than the thickness of the first insulating layer at a supporting portion of the vibration film.

13. The electromechanical transducer according to claim 11, wherein the silicon substrate functions as a first electrode, wherein the silicon layer is a monocrystalline silicon film and functions as a second electrode, and wherein the lead wire is electrically connected to the monocrystalline silicon film.

14. The electromechanical transducer according to claim 12, wherein a groove is formed in the silicon layer around each of a plurality of elements, each of the elements is electrically isolated.

* * * * *